United States Patent [19]
Holman, Jr. et al.

[11] Patent Number: 5,495,584
[45] Date of Patent: Feb. 27, 1996

[54] SCSI BUS CONCATENATOR/SPLITTER

[75] Inventors: Thomas H. Holman, Jr.; Peter D. Geiger, both of Austin, Tex.

[73] Assignee: Dell USA, L.P., Austin, Tex.

[21] Appl. No.: 28,506

[22] Filed: Mar. 9, 1993

[51] Int. Cl.$^6$ .......................... G06F 13/00; H03H 11/28; H04B 3/00
[52] U.S. Cl. .................... 395/308; 395/280; 340/825.06; 326/30; 370/53; 364/240.2; 364/239.9; 364/240; 364/DIG. 1
[58] Field of Search ...................................... 395/325, 275, 395/425, 308, 280; 340/825.5, 825.06; 370/85.1, 53; 326/30

[56] References Cited

U.S. PATENT DOCUMENTS

| | | | |
|---|---|---|---|
| 4,245,301 | 1/1981 | Rokutanda et al. | 395/325 |
| 4,422,142 | 12/1983 | Inaba et al. | 395/325 |
| 4,812,840 | 3/1989 | Girard | 340/840.5 |
| 4,814,977 | 3/1989 | Buonomo et al. | 395/425 |
| 4,821,170 | 4/1989 | Bernick et al. | 395/275 |
| 4,975,838 | 12/1990 | Mizuno et al. | 395/275 |
| 4,984,195 | 1/1991 | Nakamura et al. | 395/325 |
| 5,083,259 | 1/1992 | Maresh et al. | 395/325 |
| 5,202,980 | 4/1993 | Morita et al. | 395/575 |
| 5,305,317 | 4/1994 | Szezepanek | 370/85.5 |
| 5,313,595 | 5/1994 | Lewis et al. | 395/325 |
| 5,369,748 | 11/1994 | McFarland et al. | 395/325 |
| 5,422,580 | 6/1995 | Mandel et al. | 326/30 |

*Primary Examiner*—Gopal C. Ray
*Attorney, Agent, or Firm*—James W. Huffman; David L. McCombs

[57] ABSTRACT

A system is described for selectively configuring a backplane-based SCSI subsystem in at least two alternative drive configurations. A concatenator/splitter (C/S) device enables a user to concatenate several SCSI devices onto a single bus, or alternatively to split the devices onto multiple buses. In either configuration, the bus or buses are properly terminated. The C/S device is located on the backplane between two buses and is connected to each bus by a connector section. A removable interface module plugs into the connector section in either an upright or upside-down orientation, as selected by the user, to choose either a concatenated or split bus configuration. A terminating network is included in the interface module in order to terminate the first bus when the subsystem is configured in the split bus arrangement.

15 Claims, 2 Drawing Sheets

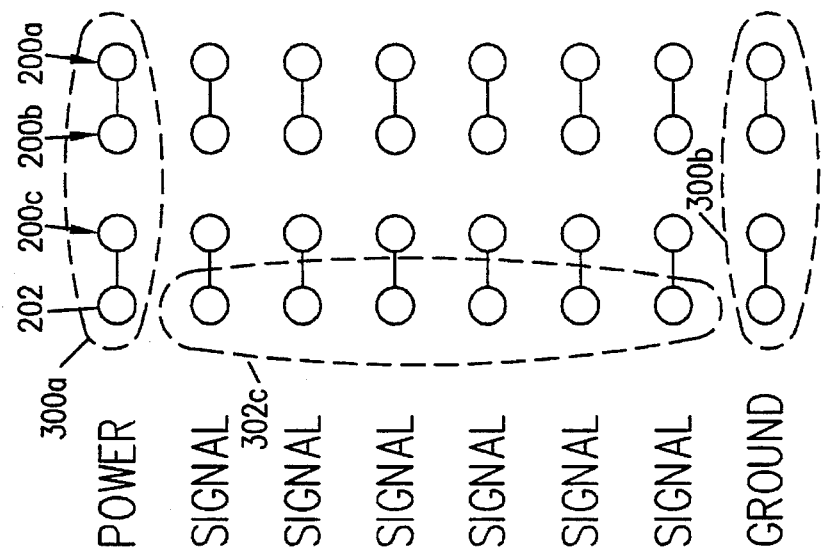
FIG. 3
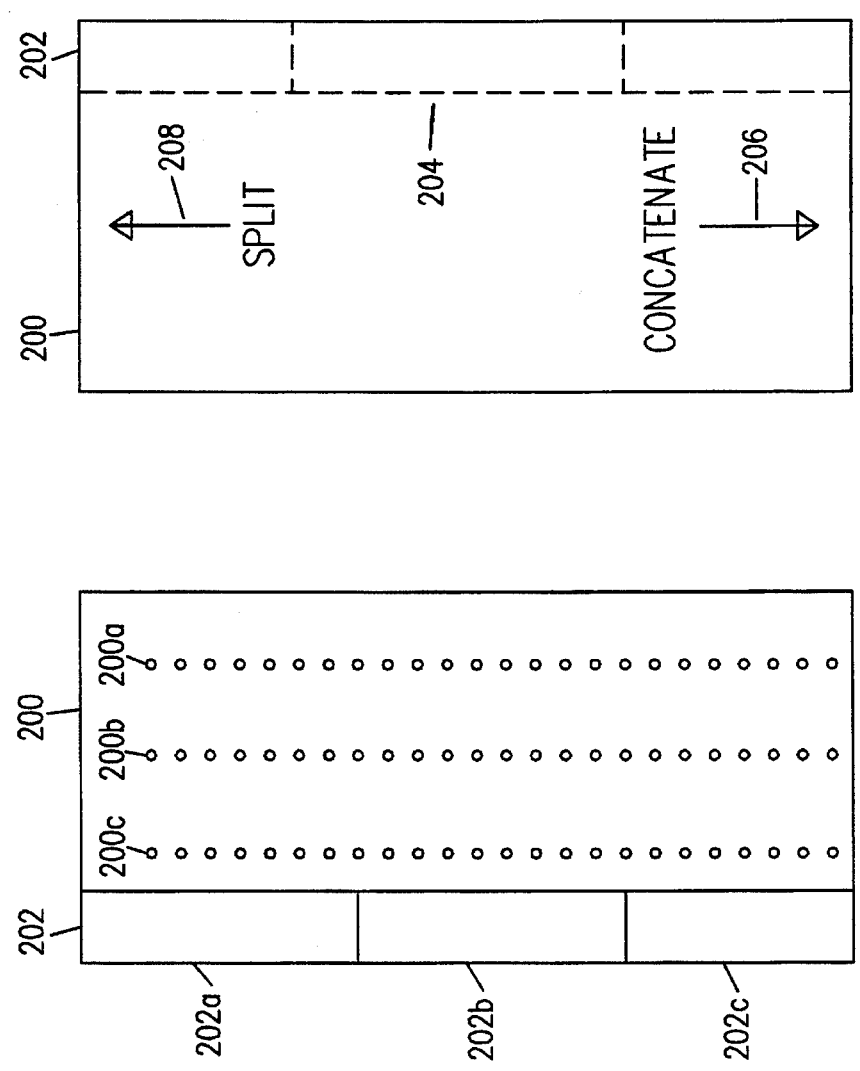
FIG. 2b
FIG. 2a

SCSI BUS CONCATENATOR/SPLITTER

TECHNICAL FIELD

The invention relates generally to small computer system interface (SCSI) subsystems and more specifically to apparatus and method for alternatively concatenating or splitting SCSI buses running across a hardwired backplane to provide multiple bus configurations.

BACKGROUND OF THE INVENTION

Many personal computers (PCs) employ small computer system interface (SCSI) buses for controlling data transfers between a host computer system and peripheral devices, and among the peripheral devices. Generally, a single SCSI bus can support up to seven peripheral devices, in addition to the host system. SCSI bus protocol is directly implemented by the devices connected to the bus, thereby eliminating the need for a separate bus controller, and is described in detail by the American National Standards Institute in its publication entitled ANSI X3.13 1-1986, incorporated herein by reference.

The SCSI bus includes a set of conductive lines for carrying electrical bus signals and terminators at both ends of the bus. It is well known that both ends of a SCSI bus must be properly terminated to prevent noise on the bus and to maintain the bus in a known state. Typically, terminating means are provided within the host computer system for terminating one end of the bus. The other end of the bus is terminated by various methods, depending on how the subsystem is configured.

For example, some SCSI subsystems are configured using multiconductor cables to chain several peripheral devices together and connect them to a SCSI bus. To properly terminate the end of the bus in such subsystems, a user must physically install a terminating means onto the peripheral device connected to the end of the bus by, for example, plugging a cable adaptor containing terminating resistors into the unused port of the end device or by removing the housing of the end device and inserting a removable package of terminating resistors into a socket on the printed circuit board of the device.

Cable based subsystems such as those described above have certain disadvantages. First, bus protocol, described in the aforementioned ANSI X3.131-1986 publication, requires that a unique identification code be established for each device on the bus. Therefore, each time the devices are reconfigured or one or more of the devices are removed for servicing, the user must reestablish the device identification codes. Moreover, to properly terminate the bus, the user must determine which device is connected to the end of the bus and then install terminating means on that device while making sure that none of the other devices have terminating means installed thereon. Should the identification codes be improperly assigned or the terminating means be improperly installed, the subsystem will not function. As a result, reconfiguring the subsystem or servicing the devices is time-consuming, inconvenient and complicated.

As a solution to these problems, SCSI subsystems can be designed around a hardwired backplane to route one or more SCSI buses to the peripheral devices. Terminating means are installed on the backplane to properly terminate the buses. Drive bays are interconnected by the buses and provide an interface between the buses and the devices. As a result, there is no need for a user to install separate terminating means, as the buses are terminated at the terminating means installed on the backplane, nor must a user reestablish device identification codes each time a device is removed. Furthermore, assembly, service and customer upgrades are facilitated because there are no cables to disconnect and reconnect, and system insulation and reliability is increased significantly. However, backplane-based SCSI subsystems also have certain disadvantages. Because a backplane-based SCSI subsystem is necessarily hardwired, the flexibility to provide multiple drive (or other device) configurations is lost. Accordingly, such subsystems cannot be configured to provide for mirroring and duplexing, for example, which involve transferring identical sets of data to multiple sets of disk drives in case one drive becomes inoperable or one set of data is destroyed.

What is needed is a backplane-based SCSI subsystem which can be easily reconfigured by a user. This would be especially useful for reconfiguring a subsystem in multiple drive configurations.

SUMMARY OF THE INVENTION

The foregoing problems are solved and a technical advance is achieved by apparatus and method for selectively configuring a backplane-based SCSI subsystem in at least two alternative drive configurations. In a departure from the art, a reconfiguration system of the invention enables a user to concatenate separate SCSI buses, each supporting its own SCSI drive devices, to create a single bus channel, or alternatively to split the buses to create separate bus channels. In either configuration, the bus or buses are properly terminated.

In one illustrative embodiment, the system comprises a specially designed SCSI backplane having two separate SCSI buses, each equipped with three drive bays to which SCSI drives or other devices are connected. Two input connectors are provided on the backplane for selectively connecting the SCSI buses to different SCSI controllers in a host computer, depending on the desired number of subsystem channels. The input connectors are each connected to a SCSI controller card via a short ribbon cable, for example. A bus configuration device is located on the backplane between the buses and is hardwired to each bus. The configuration device includes a connector section, and a removable interface module that plugs into the connector section in either an upright or upside-down orientation, as selected by the user, to choose either a concatenated or split bus configuration. The connector section is part of the backplane and includes first, second and third connector pin rows, which are hardwired, respectively, to the first bus, the second bus and the second one of the input connectors via a third bus. The interface module has three connector pad rows, which are able to mate with the connector section pin rows in both the upright and upside-down orientation. The first and second connector pad rows of the interface module are hardwired together within the module, and the third is electrically isolated from the other two. Accordingly, engagement of the interface module with the connector section will either concatenate the buses or split them into electrically isolated buses, depending on the orientation of the module with respect to the connector section. A terminating network row is included in the interface module, and is hardwired to the third interface module connector pad row to terminate the first bus when the subsystem is configured in the split bus arrangement.

When the interface module of the bus configuration-device engages the connector section right-side up, the first and second connector pad rows of the interface module mate with the first and second connector pin rows of the connector section. As a result, the first bus, which interconnects the first three drive bays, and the second SCSI bus, which interconnects the second three drive bays, are concatenated into a single, six-bay channel. The six-bay channel is connected by the first bus to a first of the input connectors on the backplane and is properly terminated by terminating networks on the backplane connected to the second bus. It should also be noted that in this configuration, the third connector pad row of the module engages the third connector pin row of the connector section, the third connector pin row being hardwired by the third bus on the backplane to the second input connector. This engagement is inconsequential, since the second input connector is not being used in the single channel configuration.

When the interface module of the configuration device is instead plugged into the connector section upside-down, the third, second and first connector pad rows of the module mate with the first, second and third connector pin rows of the connector section, respectively. Since the first and second connector pad rows are hardwired together within the interface module, the buses are split into separate three-bay channels. The first bus is connected at one end to the first input connector, and is terminated through the first connector pin row of the connector section by engagement to the third connector pad row of the module, since the third connector pad row is hardwired to terminating networks within the module. The second bus is connected through the module to the second input connector, since the third connector pin row of the connector section is hardwired on the backplane by the third bus to the second input connector. The second bus is terminated by the backplane terminating networks hardwired thereto. In this configuration, two three-bay channels are provided and both are properly terminated.

A technical advantage achieved with the invention is that it eliminates the use of cables in configuring an SCSI subsystem by replacing the cables with a hardwired backplane, yet it permits the backplane to be reconfigured to support multiple SCSI channel configurations. This is especially useful in configuring multiple sets of disk drives for mirroring and duplexing operations.

Another technical advantage achieved is that in either configuration, each bus channel is automatically terminated.

Another technical advantage achieved is the ease in which reconfiguration is performed by the end user. Reconfiguration is facilitated by the mating engagement of the interface module alternatively in upright and upside-down orientations to make the necessary electrical connections.

BRIEF DESCRIPTION OF THE DRAWINGS

FIG. 2a is a block diagram of the component side of a concatenator/splitter (C/S) interface module of the present invention; FIG. 2b is a block diagram of the reverse side of the module of FIG. 2a; and FIG. 3 is a schematic of the terminating network pads and connector pads of the module of FIG. 2a, patterned for six SCSI bus signals.

DESCRIPTION OF THE PREFERRED EMBODIMENTS

Figure 1:
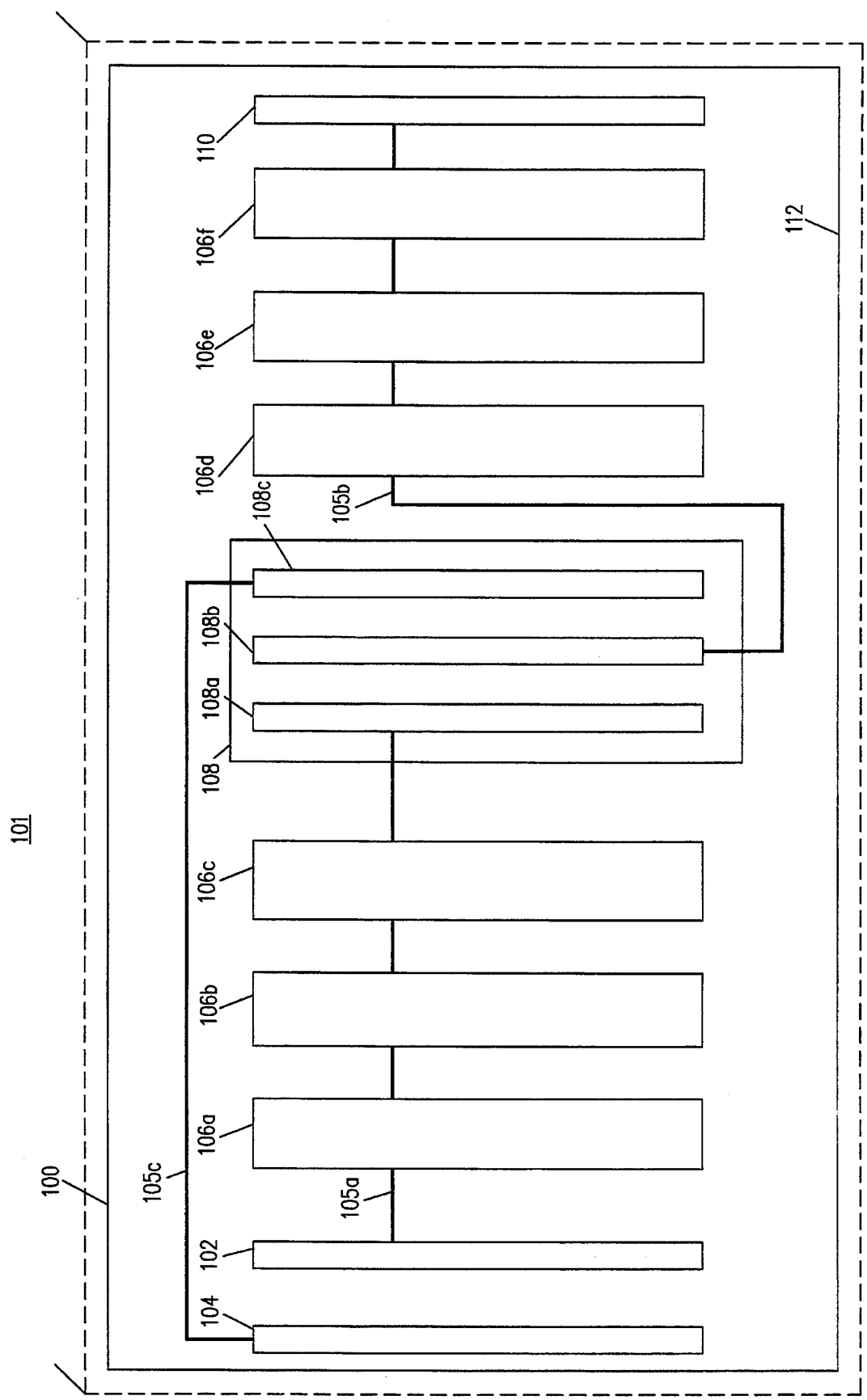
FIG. 1 is a schematic block diagram of an SCSI backplane board of the present invention.

In FIG. 1, the reference numeral 100 designates a hardwired small computer system interface (SCSI) backplane embodying features of the present invention. It is understood that the backplane 100 is a board used to provide electrical connections between components (not shown) of a personal computer 101 or other electronic device, the components being plugged into the backplane at right angles with respect thereto. The backplane 100 comprises two input connectors 102 and 104, three SCSI buses 105a, 105b and 105c, six drive bays 106a–106f, a concatenator/splitter (C/S) connector section 108 and a row of terminating networks 110. While not shown, the input connectors 102 and 104 may be connected to SCSI controller cards in the computer 101 as a signal source, via a short ribbon cable or similar arrangement. Connectors on the other side (not shown) of the backplane 100 are provided to connect the bays 106a–106f to SCSI peripheral devices (also not shown) of the computer 101. The peripheral devices, such as disk drives, are typically plugged into the bays 106a–106f by the end user as needed. It is understood that for connection of alternative electronic devices to the buses, various forms of device connectors other than the bays 106a–106f are used.

The C/S connector section 108 comprises three rows 108a–108c of connector pins, each of which is connected to one of the buses 105a–105c, respectively. The bus 105c interconnects the input connector 104 and the third connector pin row 108c. The bus 105a interconnects the input connector 102, the three drive bays 106a–106c and the connector pin row 108a. The bus 105b interconnects the middle pin row 108b, the drive bays 106d–106f and the terminating networks 110.

FIGS. 2a and 2b illustrate a concatenator/splitter (C/S) interface board or module 200. Together with the connector section 108 (FIG. 1), the interface module 200 defines a bus configuration device for selecting the particular SCSI channel configuration of the backplane 100. The interface module 200 includes connector pad rows, described in detail below, that mate with the connector pin rows of the connector section 108. The interface module 200 engages the connector section 108 either in an upright orientation with respect to the bottom 112 of the backplane 100, to concatenate the buses 105a, 105b on a single channel, or alternatively in an upside-down orientation to split the buses into separate channels.

FIG. 2a illustrates the component side of the interface module 200. The interface module 200 comprises three rows 200a–200c of connector pads, which are designed to interface the connector pin rows 108a–108c of the connector section 108 (FIG. 1 ), and a row 202 of terminating network pads. As will be described in detail with reference to FIG. 3, the pads of the row 200c are hardwired to the pads of the row 202 so that signals routed to the pad row 200c are terminated by the row 202 of terminating network pads. In the illustrated embodiment, the row 202 of terminating network pads comprises three, single in-line package (SIP) terminators 202a, 202b and 202c; however, alternative terminating logic may be employed.

FIG. 2b illustrates the reverse side of the interface module 200. Dashed lines 204 represent the placement of the row 202 of terminating networks on the component side (FIG. 2a) of the module 200 relative to the back of the module 200. As will be further described in detail, when the module 200 is inserted into the connector section 108 with the arrow 206 labeled "CONCATENATE" directed toward the bottom 112 of the backplane 100, the module 200 concatenates the bays 106a–106f onto a single six-bay channel comprised of the buses 105a, 105b, connected to the first input connector 102. Alternatively, when the module 200 is inserted into the connector section 108 with the arrow 208 labeled "SPLIT"

directed toward the bottom 112 of the backplane 100, the module splits the bays 106a–106f onto two, three-bay channels. The first channel comprises bus 105a and interconnects bays 106a–106c with the input connector 102, and the second channel comprises buses 105b, 105c and interconnects bays 106d–106f with the second input connector 104.

FIG. 3 is a schematic illustration of the connections between the connector pad rows 200a–200c and the terminating network pad row 202 for six SCSI bus signals. Each of the connector pads of the row 200c are electrically coupled or "hardwired" to terminating network pads of the row 202 so that signals entering the row 200c are routed into the terminating network pads of the row 202. Each of the connector pads of the row 200b are hardwired to connector pads of the row 200a, to create a continuous signal path. It is understood that POWER and GROUND pads 300a and 300b must be properly connected to a positive five volts and ground, respectively, in order for bus signals to be properly terminated by six SIGNAL pads 302. It is further understood that the arrangement illustrated in FIG. 3 is repeated with respect to each group of six bus signals, as each SIP terminator 202a, 202b, 202c is capable of terminating up to six signals and each bus 105a, 105b, 105c carries a total of eighteen signals which must be terminated.

Operation of the invention is now described in detail with reference to FIGS. 1–3. As previously indicated, the interface module 200 is designed to interface the connector section 108 either in a first mode to concatenate the buses 105a, 105b into a single bus channel interconnecting bays 106a–106f, or alternatively in a second mode in which the buses 105a, 105b are split to comprise two separate bus channels, one interconnecting bays 106a–106c, and the other interconnecting bays 106d–106f. The first channel is comprised of the bus 105a which interconnects the bays 106a–106c to the first input connector 102. The first channel is terminated by the terminating networks 202 within the module. The second channel is comprised of the buses 105b, 105c which interconnect the bays 106d–106g to the second input connector 104. The second channel is terminated by the terminating networks 110 hardwired on the backplane 100 to the second bus 105b.

The single channel, six-bay mode is established when the interface module 200 is mated with the connector section 108 in an upright position, i.e., with the arrow 208 directed toward the top 112 of the backplane 100. In this orientation, the connector pad rows 200a, 200b, 200c of the module 200 interface the connector pin rows 108a, 108b, 108c of the connector section 108, respectively. As a result, bus 105a is connected to bus 105b because the pin rows 108a and 108b are electrically coupled with the pad rows 200a and 200b, and the pad rows 200a, 200b are hardwired together as previously described with reference to FIG. 3. The concatenated bus 105a/105b is properly terminated at the row 110 of terminating networks via the bus 105b. Note that the bus 105c is improperly terminated, due to the improper orientation of the POWER and GROUND pads 300a and 300b. In this configuration, however, the improper termination is inconsequential, as the bus 105c is not used. It is understood that in a single bus channel configuration, only the input connector 102 is connected to a SCSI controller card (not shown) in the computer 101 for providing bus signals.

The second mode is established when the interface module 200 is instead coupled by the user to the connector section 108 upside down, i.e., with the arrow 206 directed toward the top 112 of the backplane 100. In this orientation, the pad rows 200c, 200b, 200a interface the pin rows 108a, 108b, 108c, respectively. Accordingly, the bus 105a is routed to the terminating network pad row 202 via the pin row 108a and pad row 200c. Bus 105c is connected to bus 105b via the pin rows 108b, 108c and pad rows 200b, 200a in the manner previously described. In the split configuration, the buses 105a and 105c/105b are properly terminated at the rows of terminating networks 202 and 110, respectively. In this configuration, both of the input connectors 102, 104 are connected to SCSI control cards (not shown) in the computer 101 for providing bus signals.

It is understood that the present invention can take many forms and embodiments. The embodiments shown herein are intended to illustrate rather than to limit the invention, it being appreciated that variations may be made without departing from the spirit or the scope of the invention. For example, it is anticipated that the invention may be used to concatenate or split any number of bus channels each supporting any number of peripheral devices. Multiple bus configuration devices on a single backplane are contemplated. The invention may comprise a backplane having two halves, each half configured as shown in FIG. 1, and two interface modules, thereby enabling the subsystem to be configured as two six-bay channels or four three-bay channels. In addition to disk drive peripheral devices, other devices may be interconnected. The pin and pad electrical connections of the connector section and module may be reversed or replaced with other components, switches or interface arrangements, and the number of connections and connector rows may vary. Various types of SCSI subsystems as well as any other type of electrical subsystem may employ principles of the invention.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A computer system with user reconfigurable small computer system interface (SCSI) bus channels, each said channel connectable to a separate SCSI signal source, said system comprising:

a board supporting first and second source connectors each connectable to a separate signal source, a first SCSI bus connected to said first source connector, a first bus connector connected to said first SCSI bus, a second SCSI bus connected to a second bus connector, and a third connector connected to said second source connector; and means for selective operation in either a first mode to concatenate said first and second SCSI buses with said first source connector by electrically coupling said first bus connector with said second bus connector, whereby, said concatenated buses are electrically isolated from said second source connector; or alternatively in a second mode to separately connect said first SCSI bus with said first source connector and said second SCSI bus with said second source connector, by electrically coupling said second bus connector with said third connector;

wherein said means for selective operation comprises a module engageable with said board in a first orientation to effect said first mode and engageable with said board in a second orientation to effect said second mode said module including a terminating network, such that when said coupling means operates in said second mode, said terminating network is electrically coupled to said first bus connector, thereby electrically terminating said first bus;

said system further comprising a second terminating network connected to said second bus for electrically terminating said second bus.

2. The system of claim 1 wherein said board comprises a computer backplane.

3. The system of claim 1 wherein said module further means comprises:

a first connector interface;

a second connector interface electrically connected to said first connector interface; and a third connector interface electrically isolated from said first and second connector interfaces;

such that in said first mode, said first connector interface engages said first bus connector and said second connector interface engages said second bus connector, thereby electrically concatenating said first and second buses; and such that in said second mode, said first connector interface engages said third connector and said second connector interface engages said second bus connector, thereby electrically connecting said second bus to said second source connector.

4. The apparatus of claim 1 wherein said selective operation between said modes is manually selected.

5. Apparatus having user reconfigurable bus channels, each said channel connectable to a signal source, said apparatus comprising:

first and second source connectors each for connecting a separate signal source thereto;

first and second buses each for connecting separate devices thereto, said first bus connected to said first source connector;

a terminating network connected to said second bus;

a first bus connector connected to said first bus, a second bus connector connected to said second bus, and a third connector connected to said second source connector; and a module engageable with said first bus connector, said second bus connector and said third connector in a first orientation and alternatively in a second orientation, said module including a first connector interface, a second connector interface connected to said first connector interface, a third connector interface electrically isolated from said first and second connector interfaces, and a terminating network connected to said third connector interface;

such that in said first orientation, said first connector interface engages said first bus connector and said second connector interface engages said second bus connector, thereby electrically concatenating said first and second buses, said concatenated buses being connected to said first source connector, and said concatenated buses being terminated by said second bus terminating network; and such that in said second orientation, said first connector interface engages said third connector and said second connector interface engages said second bus connector, thereby electrically connecting said second bus to said second source connector, and whereby said first and second buses are electrically isolated, and such that said third connector interface engages said first bus connector, whereby said first bus is terminated by said module terminating network;

said apparatus further comprising a second terminating network connected to said second bus for electrically terminating said second bus.

6. The apparatus of claim 5 wherein said orientations are manually selected.

7. Apparatus for electrically connecting in alternative configurations a plurality of electronic devices to one or more signal sources, the apparatus comprising:

first and second buses;

a first terminating network electrically connected to said second bus;

first and second source connectors each for connecting a separate signal source thereto, said first source connector being electrically connected to said first bus; and a bus configuring device comprising:

a first bus connector connected to said first bus, a second bus connector connected to said second bus, and a third connector connected to said second source connector; and means for selectively coupling said first bus connector with said second bus connector in order to concatenate said first and second buses, and alternatively for selectively coupling said second bus connector with said third connector in order to connect said second, bus to said second source connector, such that said first bus is electrically isolated from said second bus;

said coupling means further comprising:

a first connector interface;

a second connector interface connected to said first connector interface;

a third connector interface electrically isolated from said first and second connector interfaces; and a second terminating network connected to said third connector interface for terminating a bus electrically connected to said third connector interface;

said coupling means adapted to connect to said bus connectors either in a first orientation, in which said first connector interface engages said first bus connector and said second connector interface engages said second bus connector, thereby concatenating said first and second buses; said first terminating network electrically terminating said concatenated buses, or in a second orientation, in which said first connector interface engages said third connector and said second connector interface engages said second bus connector, thereby connecting said second bus to said second source connector and electrically isolating said first and second buses from one another and wherein said first terminating network electrically terminates said second bus and said second terminating network electrically terminates said first bus.

8. The apparatus of claim 7 further comprising a backplane for supporting said buses, source connectors and said bus configuring device.

9. The apparatus of claim 7 further comprising at least one device connector on each said bus for connecting an electronic device to said bus.

10. The apparatus of claim 7 wherein said at least one device connector comprises a drive bay.

11. The apparatus of claim 7 wherein said connection between said coupling means and said bus configuration devices is manually selected.

12. Apparatus for selectively electrically connecting at least two buses to one or more signal sources in alternative configurations, the apparatus comprising:

a board supporting first and second source connectors each connectable to a separate signal source, a first bus having a first end connected to said first source connector and a second end connected to a first bus connector, a second bus having a first end connected to a second bus connector and a second end connected to a first terminating network, and a third connector connected to said second source connector; and means for selective operation in either a first mode to concatenate said first and second buses with said first source connector by electrically coupling said first bus connector with said second bus connector, whereby, said concatenated buses are electrically isolated from said second source connector; or alternatively in a second mode to separately connect said first bus with said first source connector and said second bus with said second source connector, by electrically coupling said second bus connector with said third connector;

said means for selective operation further comprising:
 a first connector interface;
 a second connector interface connected to said first connector interface;
 a third connector interface electrically isolated From said first and second connector interfaces; and
 a second terminating network electrically connected to said third connector interface for terminating a bus electrically connected to said third connector interface;

such that in said first mode, said first connector interface engages said first bus connector and said second connector interface engages said second bus connector, thereby concatenating said first and second buses;

such that in said second mode, said first connector interface engages said third connector and said second connector interface engages said second bus connector, thereby terminating said first bus with said second terminating network and connecting said second bus to said second source connector; and said apparatus further comprising a third terminating network connected to said second bus for electrically terminating said second bus.

13. The apparatus of claim 12 wherein said coupling means comprises a module engageable with said board in a first orientation to effect said first mode and engageable with said board in a second orientation to effect said second mode.

14. The apparatus of claim 12 further comprising a terminating network electrically connected to said selective operation means, such that when said coupling means operates in said second mode, said terminating network is electrically coupled to said first bus connector, thereby electrically terminating said first bus.

15. The apparatus of claim 12 wherein said selective operation between said modes is manually selected.

* * * * *